United States Patent
Imayoshi et al.

(10) Patent No.: US 10,056,322 B2
(45) Date of Patent: Aug. 21, 2018

(54) INTERPOSERS, SEMICONDUCTOR DEVICES, METHOD FOR MANUFACTURING INTERPOSERS, AND METHOD FOR MANUFACTURING SEMICONDUCTOR DEVICES

(71) Applicant: TOPPAN PRINTING CO., LTD., Tokyo (JP)

(72) Inventors: Koji Imayoshi, Tokyo (JP); Syuji Kiuchi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/278,900

(22) Filed: Sep. 28, 2016

(65) Prior Publication Data

US 2017/0018492 A1 Jan. 19, 2017

Related U.S. Application Data

(63) Continuation of application No. PCT/JP2015/001854, filed on Mar. 31, 2015.

(30) Foreign Application Priority Data

Mar. 31, 2014 (JP) .................................. 2014-073444
Mar. 31, 2014 (JP) .................................. 2014-073445

(51) Int. Cl.
*H01L 23/498* (2006.01)
*H01L 21/48* (2006.01)
*H01L 23/00* (2006.01)

(52) U.S. Cl.
CPC ...... *H01L 23/49827* (2013.01); *H01L 21/486* (2013.01); *H01L 23/49822* (2013.01);
(Continued)

(58) Field of Classification Search
CPC ............... H01L 21/486; H01L 25/0655; H01L 21/0274; H01L 23/49816; H01L 23/15;
(Continued)

(56) References Cited

U.S. PATENT DOCUMENTS

2005/0012217 A1* 1/2005 Mori ................. H01L 23/49822
257/758
2011/0204517 A1* 8/2011 Gu ......................... H01L 23/481
257/751
(Continued)

FOREIGN PATENT DOCUMENTS

EP 1 830 615 A1 9/2007
JP 2000-332168 A 11/2000
(Continued)

OTHER PUBLICATIONS

International Search Report issued in International Patent Application No. PCT/JP2015/001854 dated Jun. 30, 2015.
(Continued)

*Primary Examiner* — Jessica Manno
*Assistant Examiner* — Mohammed R Alam
(74) *Attorney, Agent, or Firm* — Foley & Lardner LLP

(57) ABSTRACT

An interposer which can better prevent detachment of a conductive layer pattern due to thermal expansion and thermal contraction. The interposer includes a substrate having a through hole; an insulative resin layer formed on a surface of the substrate and including a conductive via; a wiring layer disposed on the substrate with the insulative resin layer interposed therebetween; an inorganic adhesive layer formed only on a side surface of the through hole; and a through electrode filled in a connection hole which is formed by the inorganic adhesive layer in the through hole so as to penetrate between both surfaces of the substrate, wherein the through electrode is electrically connected to the
(Continued)

wiring layer via the conductive via, and a thermal expansion coefficient of the inorganic adhesive layer is larger than a thermal expansion coefficient of the substrate and smaller than a thermal expansion coefficient of the through electrode.

11 Claims, 14 Drawing Sheets

(52) U.S. Cl.
CPC .. *H01L 23/49838* (2013.01); *H01L 23/49866* (2013.01); *H01L 23/49894* (2013.01); *H01L 23/49816* (2013.01); *H01L 24/16* (2013.01); *H01L 24/32* (2013.01); *H01L 24/73* (2013.01); *H01L 2224/16225* (2013.01); *H01L 2224/16227* (2013.01); *H01L 2224/32225* (2013.01); *H01L 2224/73204* (2013.01); *H01L 2924/0105* (2013.01); *H01L 2924/01028* (2013.01); *H01L 2924/01044* (2013.01); *H01L 2924/01046* (2013.01); *H01L 2924/01047* (2013.01); *H01L 2924/01078* (2013.01); *H01L 2924/01079* (2013.01); *H01L 2924/01082* (2013.01); *H01L 2924/01083* (2013.01); *H01L 2924/0665* (2013.01); *H01L 2924/07025* (2013.01); *H01L 2924/1579* (2013.01); *H01L 2924/15174* (2013.01); *H01L 2924/15311* (2013.01); *H01L 2924/15738* (2013.01); *H01L 2924/15747* (2013.01); *H01L 2924/15763* (2013.01)

(58) Field of Classification Search
CPC ......... H01L 23/49827; H01L 23/49838; H01L 23/49894; H01L 2924/0002
See application file for complete search history.

(56) References Cited

U.S. PATENT DOCUMENTS

| 2012/0313226 | A1 | 12/2012 | Koizumi et al. | |
|---|---|---|---|---|
| 2013/0119555 | A1* | 5/2013 | Sundaram | H01L 21/486 |
| | | | | 257/774 |
| 2014/0138848 | A1* | 5/2014 | Matsuura | H01L 23/481 |
| | | | | 257/774 |

FOREIGN PATENT DOCUMENTS

| JP | 2001-102479 A | 4/2001 |
|---|---|---|
| JP | 2002-261204 A | 9/2002 |
| JP | 2002-373962 A | 12/2002 |
| JP | 2004-111915 A | 4/2004 |
| JP | 2007-059452 A | 3/2007 |
| JP | 2012-114400 A | 6/2012 |
| JP | 2013-521663 A | 6/2013 |
| WO | WO-2013/150940 A1 | 10/2013 |

OTHER PUBLICATIONS

Extended European Search Report dated May 24, 2018 in corresponding application No. 15772825.4.

* cited by examiner

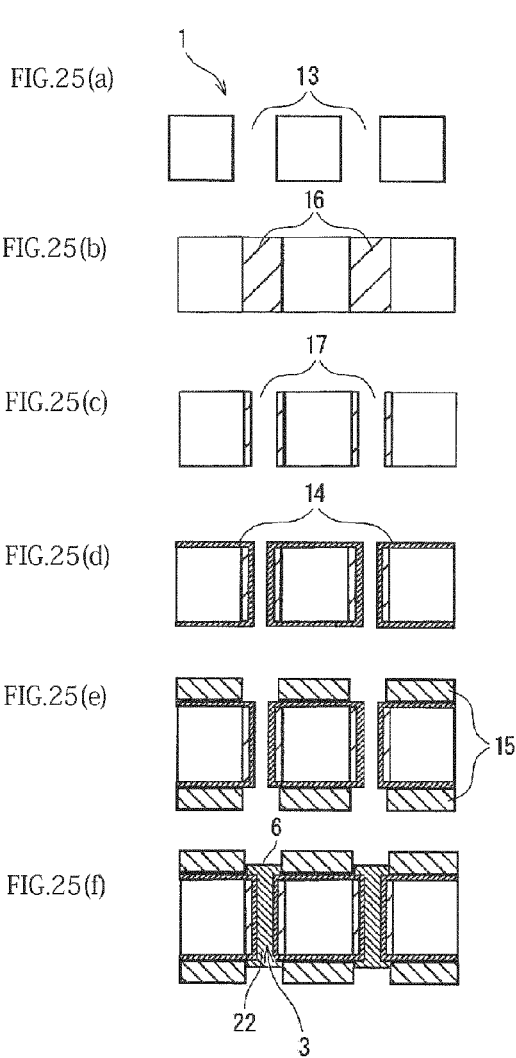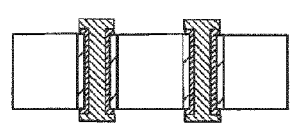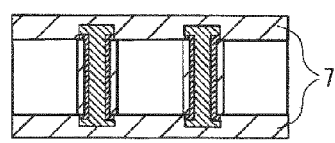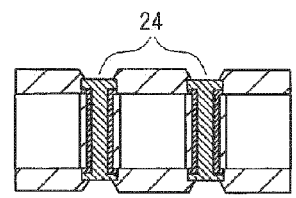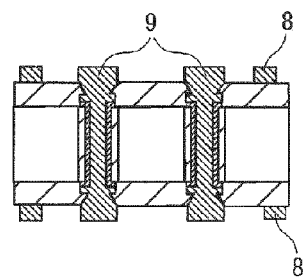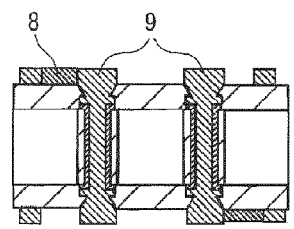
FIG.25(a) FIG.25(b) FIG.25(c) FIG.25(d) FIG.25(e) FIG.25(f) FIG.25(g) FIG.25(h) FIG.25(i) FIG.25(j) FIG.25(k)

INTERPOSERS, SEMICONDUCTOR DEVICES, METHOD FOR MANUFACTURING INTERPOSERS, AND METHOD FOR MANUFACTURING SEMICONDUCTOR DEVICES

CROSS-REFERENCE TO RELATED PATENT APPLICATIONS

This application is a continuation application filed under 35 U.S.C. § 111(a) claiming the benefit under 35 U.S.C. §§ 120 and 365(c) of International Application No. PCT/JP2015/001854 filed on Mar. 31, 2015, which is based upon and claims the benefit of priority of Japanese Patent Application No. 2014-073444, filed on Mar. 31, 2014, and Japanese Patent Application No. 2014-073445, filed on Mar. 31, 2014, the entire contents of which are all hereby incorporated by reference.

TECHNICAL FIELD

The present invention relates to interposers, semiconductor devices, methods for manufacturing interposers and methods for manufacturing semiconductor devices.

BACKGROUND

Interposers are devices that are used by being positioned between package substrates and IC chips. Techniques for positioning interposers between package substrates and IC chips are described, for example, in PTL 1 to PTL 4.

CITATION LIST

Patent Literature

PTL 1 JP-A-2001-102479
PTL 2 JP-A-2002-373962
PTL 3 JP-A-2002-261204
PTL 4 JP-A-2000-332168

SUMMARY OF THE INVENTION

Technical Problem

In manufacturing of interposers, particularly glass interposers having a glass substrate, there are some problems to be overcome.

One of these problems is a phenomenon that a conductive layer pattern made of copper or the like is detached from the surface of the glass in a high temperature process during mounting or in a temperature cycle of reliability tests. This phenomenon occurs due to an insufficiency in adhesive strength between a glass and a copper or the like relative to large differences in thermal expansion coefficients and in elastic moduluses between a glass, which is a substrate, and a copper or the like used for a conductive layer pattern (for example, through-hole electrode).

The present invention has been made to address the above problem, and has an object to provide an interposer, a semiconductor device, a method for manufacturing the interposer and a method for manufacturing the semiconductor device which can better prevent detachment of a conductive layer pattern due to thermal expansion and thermal contraction, thereby better ensuring high reliability.

Improved Solution to Problem

An aspect of the present invention provides an interposer characterized in that the interposer includes:

a substrate having a through hole;
at least one insulative resin layer formed on a surface of the substrate and including a conductive via;
at least one wiring layer disposed on the substrate with the insulative resin layer interposed therebetween;
an inorganic adhesive layer formed only on a side surface of the through hole; and
a through electrode filled in a connection hole which is formed by the inorganic adhesive layer in the through hole so as to establish electrical connection between both surfaces of the substrate, wherein
the through electrode is electrically connected to the wiring layer via the conductive via, and
a thermal expansion coefficient of the inorganic adhesive layer is larger than a thermal expansion coefficient of the substrate and smaller than a thermal expansion coefficient of the through electrode.

Advantageous Effects of Invention

According to an aspect of the present invention, it is possible to provide an interposer which can better prevent detachment of a conductive layer pattern (for example, through electrode) due to thermal expansion and thermal contraction, thereby better ensuring higher reliability.

Further, according to an aspect of the present invention, it is possible to provide a method for manufacturing the interposer, a semiconductor device having the interposer and a method for manufacturing the semiconductor device.

BRIEF DESCRIPTION OF THE DRAWINGS

FIG. 25($a$) through FIG. 25($k$) are cross-sectional manufacturing process diagrams which show the method for manufacturing the interposer according to the second embodiment of the present invention.

DESCRIPTION OF REPRESENTATIVE EMBODIMENTS

With reference to the drawings, embodiments of the present invention will be described. In the following detailed description, various specific details are described in order to provide a thorough understanding of embodiments of the present invention. However, it is obvious that those specific details are not necessarily indispensable to carry out one or more embodiments. Further, throughout the drawings, components that perform the same or like functions are denoted by the same reference numbers and the duplicated description thereof is omitted.

First Embodiment

With reference to the drawings, a first embodiment of the present invention will be described.

(Configuration of Interposer 100)

Figure 1:
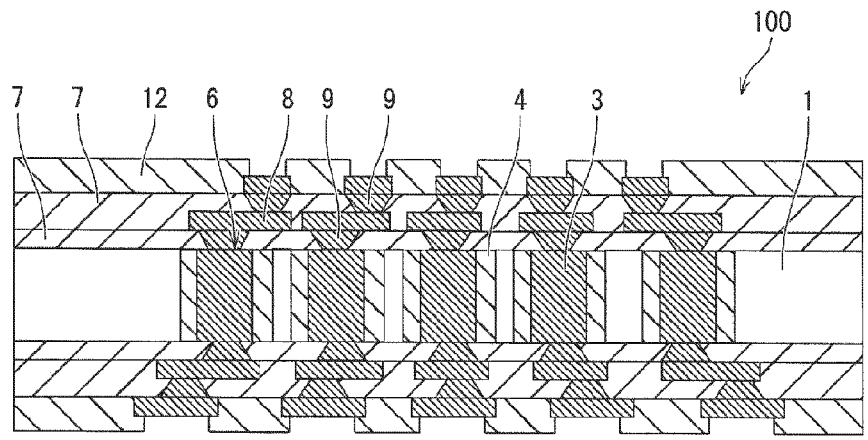
FIG. 1 is a sectional view of a schematic configuration of an interposer according to a first embodiment of the present invention.

As shown in FIG. 1, an interposer 100 includes a substrate 1, a through electrode 3, an inorganic adhesive layer 4, a land 6, an insulative resin layer 7, a wiring layer 8, and a conductive via 9. The inorganic adhesive layer 4 may also be provided on the substrate 1. Further, a conductive layer 5 (conductive layer pattern) may also be provided on the inorganic adhesive layer 4.

The substrate 1 is a substrate made of a glass (glass substrate) containing $SiO_2$ as a main component, and includes through holes 13.

The substrate 1 has a thermal expansion coefficient, which is 3 to 4 ppm/° C. for a low expansion glass and 8 to 9 ppm/° C. for a soda glass and can be controlled at 3 to 9 ppm/° C. depending on the manufacturing methods or by adding metal components such as Na.

The thermal expansion coefficient was measured in compliance with JIS:R3102 and JIS:K7197 by using a TMA (thermomechanical analysis).

Methods for forming the through hole 13 in the substrate 1 include $CO_2$ laser, UV laser, pico-second laser, femto-second laser, excimer laser, electric discharge machining, photosensitive glass and blast machining, which may be selected depending on a thickness of the substrate 1 or a hole diameter of the through hole 13.

The through electrode 3 is made of a conductive material and is disposed in the through hole 13.

Examples of conductive materials forming the through electrode 3 include metals such as copper, silver, gold, nickel, platinum, palladium, ruthenium, tin, tin silver, tin silver copper, tin copper, tin bismuth and tin lead. The materials may be used alone or as a laminate or a compound of those metals, and may be selected considering adhesiveness to the inorganic adhesive layer 4 and stability of electric connection.

Further, conductive materials forming the through electrode 3 include a conductive paste which is a mixture of a metal powder of at least one of those materials and a resin material.

Methods for forming the through electrode 3 include, but are not specifically limited to, electroless plating and electrolytic plating.

Moreover, plating for forming the through electrode 3 includes conformal plating and filled plating. In conformal plating, a through hole is left at the center of the through hole 13, which can be filled with an insulative resin or a conductive paste by using a screen printing method. When a conductive paste is used for filling, a land 6 is formed with the conductive paste and the conformal plating film so as to ensure electrical conductivity of the conductive via 9. Further, an electroless plating layer or an electrolytic plating layer may be formed as the conductive layer 5 on the surface of the conductive paste, and the land 6 can be formed with improved electrical conductivity to the conformal plating film so as to ensure electrical conductivity of the conductive via 9. On the other hand, when an insulative resin is used for filling, an electroless plating layer or an electrolytic plating layer is formed on the surface of the insulative resin to form the land 6 while ensuring electrical conductivity of the conformal plating film so as to ensure electrical conductivity of the conductive via 9.

The through electrode 3 may also be formed by forming the inorganic adhesive layer 4 and then filling the conductive paste by using a screen printing method to form the through electrode 3.

Further, the thermal expansion coefficient of a copper, which is commonly used for the conductive material, is in the order of 16 ppm/° C.

The inorganic adhesive layer 4 is formed on both surfaces of the substrate 1 and in the through hole 13. Furthermore, a portion of the inorganic adhesive layer 4, which is formed in the through hole 13, is disposed between the through electrode 3 and an inner wall surface (inner diameter surface) of the through hole 13.

Examples of materials for the inorganic adhesive layer 4 include materials having high adhesiveness between the substrate 1 and the conductive material and a thermal expansion coefficient higher than that of the substrate 1, for example, tin oxide, indium oxide, zinc oxide, nickel (thermal expansion coefficient: 15 ppm/° C.), nickel-phosphorus, chromium (thermal expansion coefficient: 8 ppm/° C.), chromium oxide, aluminum nitride, aluminum oxide, tantalum (thermal expansion coefficient: 6 ppm/° C.), titanium (thermal expansion coefficient: 9 ppm/° C.) and copper (thermal expansion coefficient: 16 ppm/° C.). Accordingly, it is possible to improve an adhesiveness between the substrate 1 and the conductive layer 5 formed on the surface of the through electrode 3 and the substrate 1. In addition to that, since the inorganic adhesive layer 4 has the thermal expansion coefficient higher than that of the substrate 1, it is possible to reduce stress across the layers caused by a difference between a linear expansion coefficient of the through electrode 3 and the conductive layer 5 and a linear expansion coefficient of the substrate 1.

An upper limit of the thermal expansion coefficient of the inorganic adhesive layer 4 is preferably lower than an upper limit of the thermal expansion coefficient of the conductive material.

Furthermore, by using the above materials having a high adhesiveness as a material for the inorganic adhesive layer 4, it is possible to reduce stress across the layers caused by a difference in thermal expansion coefficient between the conductive material and the substrate 1 and prevent detachment of the conductive material.

The above materials for the inorganic adhesive layer 4 can be used alone or as a single layer formed of a composite material of two or more, such as an ITO film (thermal expansion coefficient: 9 ppm/° C.). Further, the above materials for the inorganic adhesive layer 4 can be used as a laminated film of two or more layers formed of a composite material of two or more, such as chromium/copper or titanium/copper.

The inorganic adhesive layer 4 has a film thickness, which is not specifically limited, but may be in the range of 0.1 μm or more to 1 μm or less to achieve the effect of reducing the difference in adhesiveness to the substrate 1 and in the thermal expansion coefficient.

Further, methods for forming the inorganic adhesive layer 4 include, but are not specifically limited to, sputter deposition, electroless plating and the like.

The conductive layer 5 is made of a conductive material, and may be disposed on both surfaces of the substrate 1 via the inorganic adhesive layer 4.

Examples of conductive materials forming the conductive layer 5 include metals such as copper, silver, gold, nickel, platinum, palladium, ruthenium, tin, tin silver, tin silver copper, tin copper, tin bismuth and tin lead, which may be used alone or as a laminate or a compound of those metals. The material may be selected considering adhesiveness to the inorganic adhesive layer 4 or stability of electric connection.

Further, conductive materials forming the conductive layer 5 include a conductive paste which is a mixture of a metal powder of at least one of those materials and a resin material.

Methods for forming the conductive layer 5 include, but are not specifically limited to, electroless plating and electrolytic plating.

The land 6 may be disposed on the upper and lower ends of the through electrode 3 via the conductive layer 5.

The land 6 may be formed in the shape, for example, having a height which is the same as the surface of the substrate 1 or higher than the surface of the substrate 1 by several microns.

Methods for forming the land 6 include, but are not specifically limited to, filling the through hole 13 with a conductive material or an insulative resin, followed by grinding the surface of the resin filled in the conductive layer 5 and the through hole 13 to the surface of the substrate 1 to thereby expose the upper and lower ends of the through electrode 3 so as to provide the land 6, and patterning the conductive layer 5 on the upper and lower ends of the through electrode 3 so as to provide the land 6.

Further, methods for forming the land 6 may be, for example, cutting both ends of the through hole 13 into the shape of the land 6, followed by filling of the conductive material. In this case, the inorganic adhesive layer 4 except for a portion in contact with the land 6 is removed by an etching process in grinding or patterning.

In addition, when the through electrode 3 is formed by filled plating, the land 6 can be formed by stacking on the through electrode 3.

An outer diameter of the land 6 is the same as an inner diameter of the through hole 13. The outer diameter of the land 6 may be larger than the inner diameter of the through hole 13 considering the processing accuracy of forming the conductive via 9. In this case, possible causes of variation in processing accuracy may be expansion and contraction of the substrate 1, variation in positional accuracy of processing of the via hole or the like. By forming the land 6 to have the upper limit of the outer diameter larger than the inner diameter of the through hole 13 by 20 μm at a maximum, the conductive via 9 is prevented from falling from the land 6, thereby providing a good conductivity.

One or more insulative resin layers 7 are stacked, and the insulative resin layers 7 closest to the substrate 1 is disposed on the substrate 1 or the conductive layer 5.

A necessary number of the insulative resin layers 7 are stacked. The number of the insulative resin layers 7 may be decided, for example, depending on the design of the product.

Materials for the insulative resin layer 7 include epoxy/phenol resin, polyimide resin, cyclic-olefin and PBO resin, which can be used alone or as a composite material of two or more.

In this case, the material for the insulative resin layer 7 may be, for example, a material having the thermal expansion coefficient of 30 to 100 ppm/° C., which is higher than that of the conductive material, and a high elastic modulus so that the conductive layer 5 is prevented from detaching, if the conductive layer 5 is provided, by the insulative resin layer 7 covering the conductive layer 5 to reduce stress applied between the layers of the conductive layer 5 and the substrate 1.

Further, materials for the insulative resin layer 7 include, but are not specifically limited to, a dry film and a liquid photo solder resist.

The wiring layer 8 is formed on the insulative resin layer 7, or sandwiched between the adjacent insulative resin layers.

A necessary number of wiring layers 8 are stacked. The number of wiring layers 8 may be decided, for example, depending on the design of the product.

The wiring layer 8 may be formed, for example, by thick electrolytic plating on a seed layer formed by electroless plating or by a sputtered film, followed by patterning by semi-additive process or subtractive process. However, the method is not specifically limited thereto.

The conductive via 9 is formed in the insulative resin layer 7 so as to electrically connect the conductive layer 5 to the wiring layer 8.

A diameter (bottom diameter) of the conductive via 9 facing the substrate 1 is smaller than a diameter of the through hole 13 and a diameter of the through electrode 3. This allows for stacking of the conductive vias 9 in a stacked configuration. Accordingly, when the wiring layer 8 and the land 6 are formed on the insulative resin layer 7, the number of wirings to be disposed between the lands 6 can be increased and the hole pitch of the through holes 13 to be formed on the substrate 1 can be narrowed.

Further, the conductive via 9 is formed by a process of filling the via hole formed in the insulative resin layer 7 with a conductive material such as conformal plating.

Methods for forming the via hole in the insulative resin layer 7 may be selected, for example, depending on the material of the insulative resin layer 7. When the material of the insulative resin layer 7 is a heat-curable resin, the via hole can be formed by a process using a $CO_2$ laser or a UV laser, which is followed by, for example, a desmear process to remove smears generated in the laser process. Further, when the material of the insulative resin layer 7 is a photosensitive resist, the via hole can be formed by, for example, a photolithography process.

As described above, the interposer 100 of the present embodiment is a multi-layer interposer having through electrodes. According to the interposer 100 of the present embodiment, a high conductive reliability between the wiring layers 8 formed on both surfaces of the substrate 1 can be achieved.

In addition, the necessary numbers of the insulative resin layers 7 and the wiring layers 8, the shape and height of the metal layer of the conductive pad shown in FIG. 1 are merely one example, and are not specifically limited thereto.

(Configuration of Semiconductor Device 300)

Figure 2:
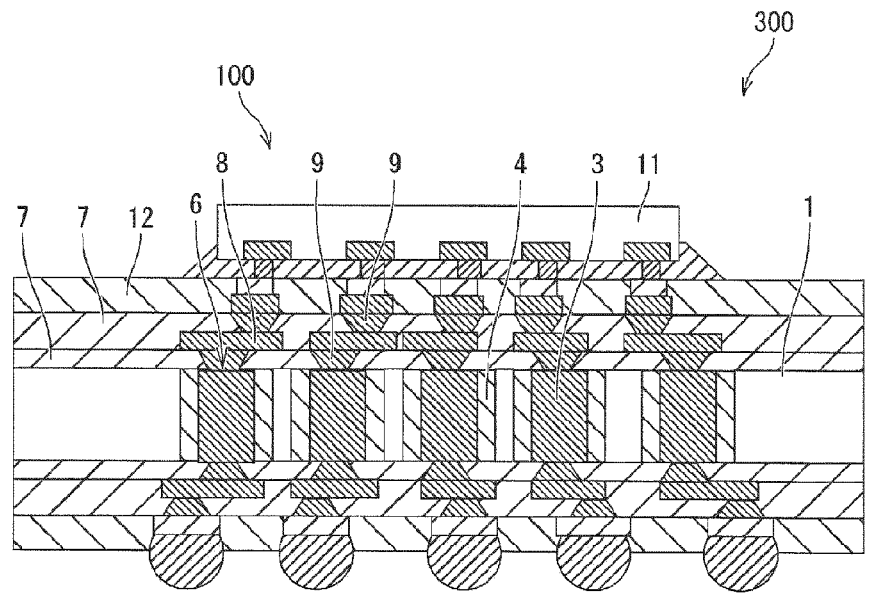
FIG. 2 is a sectional view of a schematic configuration of a semiconductor device according to the first embodiment of the present invention.

As shown in FIG. 2, a semiconductor device 300 includes the interposer 100 and a semiconductor element 11.

The interposer 100 is mounted on a printed wiring board, which is not shown in the figure, by using solder balls.

The semiconductor element 11 is mounted on one surface (upper surface in FIG. 2) of the interposer 100 by using solder balls (not shown in the figure).

The shape of the semiconductor element 11 or a connection method between the semiconductor element 11 and the interposer 100 shown in FIG. 2 are merely one example, and are not specifically limited thereto.

According to the semiconductor device 300 of the present embodiment, a high connection strength can be obtained by optimizing the material for the conductive pad between the interposer 100 and the semiconductor element 11, which is a connection target. Furthermore, a high connection reliability can be obtained by optimizing thermal deformation during mounting.

First Example

A first example of the present invention will be described in conjunction with a method for manufacturing the interposer 100 and a method for manufacturing the semiconductor device 300.

Example 1-1

With reference to FIGS. 1 and 2, Example 1-1 of the present invention will be described in conjunction with FIGS. 3 to 8.

A low expansion glass having a thickness of 0.3 mm, a size of 200 mm×200 mm and a thermal expansion coefficient of 4 ppm/° C. was provided as a substrate 1.

The inorganic adhesive layer 4 was formed by sputtering a 0.1 μm thick Cr film (thermal expansion coefficient: 8 ppm/° C.) and a 0.2 μm thick Cu film.

Further, an electrolytic copper plating layer 2 (thermal expansion coefficient: 16 ppm/° C.) was made of a conductive material. The through electrode 3 was formed by a filled copper plating technique.

An ABF made up of epoxy resin was used as a material for the insulative resin layer 7.

A seed layer for the wiring layer 8 was formed by electroless copper plating. The thickness of the electrolytic copper plating was 8 μm. The wiring layer 8 was formed by a semi-additive process with an LS value of 10 μm.

The conductive via 9 was formed by conformal plating. In forming the conductive via 9 in the insulative resin layer 7, a UV-YAG laser was used.

In forming the through hole 13 in the substrate 1, a pico-second laser was used. The inner diameter of the through hole 13 and the conductive via 9 was 50 μmϕ.

A method for manufacturing the interposer 100 according to Example 1-1 included steps of forming a through hole, forming an inorganic adhesive layer, forming a conductive layer and a through electrode, removing an unnecessary layer, forming an insulative resin layer, forming a via hole, and forming a conductive via and a wiring layer.

Details of those steps will be described.

Figure 3:
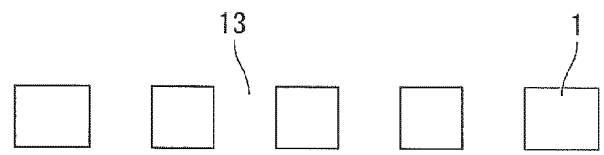
FIG. 3 is a cross sectional manufacturing process diagram which shows a method for manufacturing the interposer according to the first embodiment of the present invention.

First, in the step of forming a through hole, the through holes 13 were formed in the substrate 1 by using a pico-second laser as shown in FIG. 3.

Figure 4:
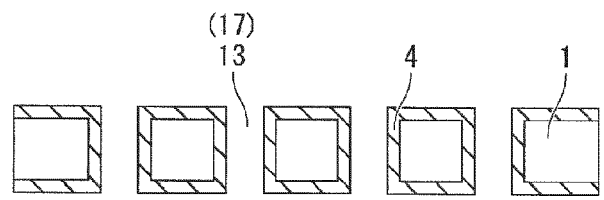
FIG. 4 is a cross sectional manufacturing process diagram which shows the method for manufacturing the interposer according to the first embodiment of the present invention.

In the subsequent step of forming an inorganic adhesive layer, a sputtered Cr film and a sputtered Cu film were continuously deposited on both surfaces of the substrate 1 so that the inorganic adhesive layer 4 was formed on the surface of the substrate 1 and the inner surface of the through hole 13 as shown in FIG. 4.

Figure 5:
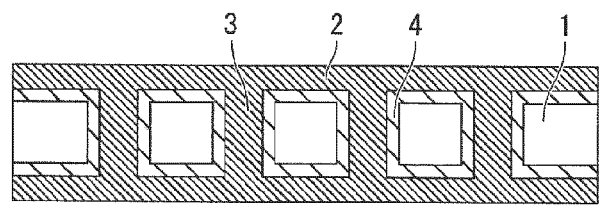
FIG. 5 is a cross sectional manufacturing process diagram which shows the method for manufacturing the interposer according to the first embodiment of the present invention.

In the subsequent step of forming a conductive layer and a through electrode, the electrolytic copper plating layer 2 was formed on the inorganic adhesive layer 4 on both surfaces of the substrate 1 by using a conductive material as shown in FIG. 5. Further, the through electrode 3 was formed in the through hole 13 by a filled plating technique that fills the through hole 13 with a copper plating.

Figure 6:
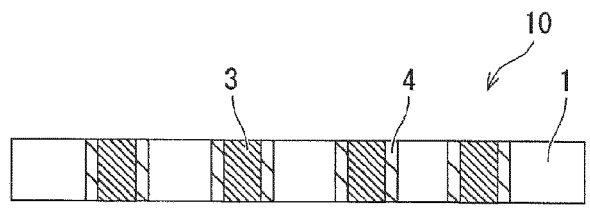
FIG. 6 is a cross sectional manufacturing process diagram which shows the method for manufacturing the interposer according to the first embodiment of the present invention.

In the subsequent step of removing an unnecessary layer, the electrolytic copper plating layer 2 formed on both surfaces of the substrate 1 was removed by chemical polishing. Then, the Cr sputtered film of the inorganic adhesive layer 4 was etched by using a ceric ammonium nitrate solution. Accordingly, a core substrate 10 having the through electrode 3 in the substrate 1 was formed as shown in FIG. 6.

Figure 7:
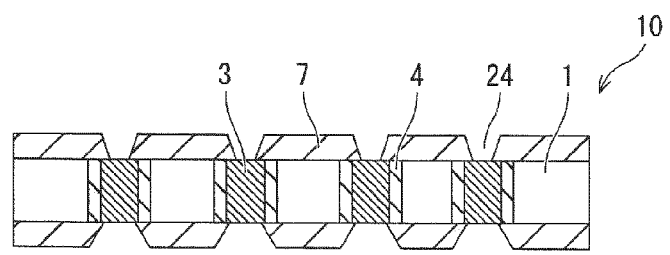
FIG. 7 is a cross sectional manufacturing process diagram which shows the method for manufacturing the interposer according to the first embodiment of the present invention.

In the subsequent step of forming an insulative resin layer and a via hole, the insulative resin layer 7 was formed by laminating an insulative resin on both surfaces of the core substrate 10. Then, a via hole 24 was formed in the insulative resin layer 7 on the through electrode 3 by using a UV-YAG laser as shown in FIG. 7. The diameter of the via hole 24 was smaller than the diameter of the through electrode 3. Furthermore, smears generated in the via hole 24 by a UV-YAG laser process were cleaned by desmearing by using a treatment solution of alkaline aqueous solution.

Figure 8:
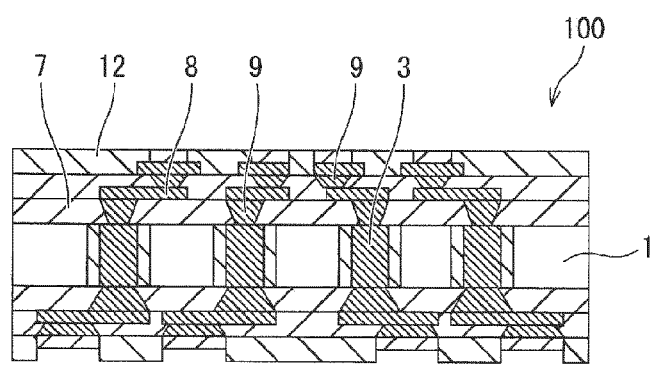
FIG. 8 is a cross sectional manufacturing process diagram which shows the method for manufacturing the interposer according to the first embodiment of the present invention.

In the subsequent step of forming a conductive via and a wiring layer, an electroless copper plating was formed as a seed layer on the insulative resin layer 7. Further, a resist pattern in which a wiring layer portion and a conductive via portion (both are not shown in the figure) were open was formed by a negative resist on the seed layer. Then, the electrolytic copper plating of 8 μm thick was formed as a conductive material by a semi-additive process as shown in FIG. 8. After that, the resist and the seed layer of the unnecessary portion were removed to form the wiring layer 8 and the conductive via 9.

A method for manufacturing the semiconductor device 300 according to Example 1-1 included steps of forming a conductive pad for forming a conductive pad on the interposer 100 manufactured in the method for manufacturing the interposer 100, and fixing a semiconductor element for fixing the semiconductor element 11 on the conductive pad.

In the step of forming a conductive pad, a photosensitive solder resist 12 was laminated on the substrate 1 for light exposure and development, and the conductive pad portion (not shown in the figure) was formed by Ni/Au plating as shown in FIG. 8.

In the subsequent step of fixing a semiconductor element, the semiconductor element 11 was fixed on the conductive pad by soldering.

In Example 1-1, two layers were disposed on one surface of the wiring layer 8, the solder resist 12 was provided as a surface covering layer, and the surface of the conductive pad was treated with Ni/Au. However, the configuration is not limited thereto.

Example 1-2

With reference to FIGS. 1 and 8, Example 1-2 of the present invention will be described in conjunction with FIGS. 9 to 15.

A low expansion glass having a thickness of 0.3 mm, a size of 200 mm×200 mm and a thermal expansion coefficient of 4 ppm/° C. was provided as a substrate 1.

The inorganic adhesive layer 4 was formed by sputtering a 0.1 μm thick Cr film (thermal expansion coefficient: 8 ppm/° C.) and a 0.2 μm thick Cu film.

Further, an electrolytic copper plating layer 2 (thermal expansion coefficient: 16 ppm/° C.) was made of a conductive material. The through electrode 3 was formed by a conformal copper plating technique. The conductive layer 5 was formed with a thickness of 8 μm.

The through hole of the through electrode 3 was filled with a conductive paste made up of a mixture material containing copper particles and an organic resin.

An ABF made up of epoxy resin was used as a material for the insulative resin layer 7.

A seed layer for the wiring layer 8 was formed by electroless copper plating. The thickness of the electrolytic copper plating was 8 μm. The wiring layer 8 was formed by a semi-additive process with an LS value of 10 μm.

The conductive via 9 was formed by conformal plating. In forming the conductive via 9 in the insulative resin layer 7, a UV-YAG laser was used.

In forming the through hole 13 in the substrate 1, a pico-second laser was used. The inner diameter of the through hole 13 and the conductive via 9 was 50 μmφ.

The conductive pad portion was formed by Ni/Au plating. In the present embodiment, the interposer 100 and the semiconductor element 11 are assumed to be connected by soldering.

A method for manufacturing an interposer 101 according to Example 1-2 included steps of forming a through hole, forming an inorganic adhesive layer, forming a conductive layer and a through electrode, forming a land, forming an insulative resin layer, forming a via hole, and forming a conductive via and a wiring layer.

Details of those steps will be described.

Figure 9:
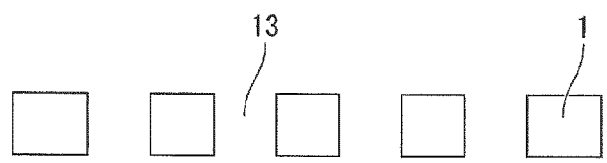
FIG. 9 is a cross sectional manufacturing process diagram which shows a method for manufacturing the interposer according to a modified example of the first embodiment of the present invention.

First, in the step of forming a through hole, the through holes 13 were formed in the substrate 1 by using a pico-second laser as shown in FIG. 9.

Figure 10:
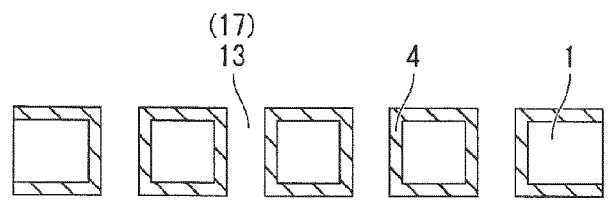
FIG. 10 is a cross sectional manufacturing process diagram which shows the method for manufacturing the interposer according to the modified example of the first embodiment of the present invention.

In the subsequent step of forming an inorganic adhesive layer, a sputtered Cr film and a sputtered Cu film were continuously deposited on both surfaces of the substrate 1 so that the inorganic adhesive layer 4 was formed on the surface of the substrate 1 and the inner surface of the through hole 13 as shown in FIG. 10.

Figure 11:
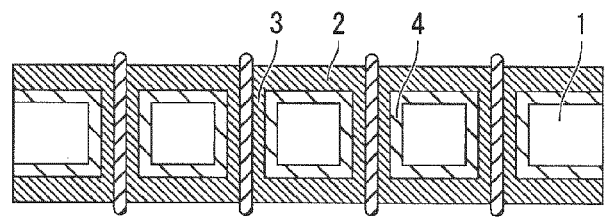
FIG. 11 is a cross sectional manufacturing process diagram which shows the method for manufacturing the inter

In the subsequent step of forming a conductive layer and a through electrode, the electrolytic copper plating layer 2 was formed on the inorganic adhesive layer 4 on both surfaces of the substrate 1 by using a conductive material as shown in FIG. 11. Further, the through electrode 3 was formed in the through hole 13 by a conformal plating technique that fills the through hole 13 with a copper plating. The through-hole of the electrode 3 was cured after the conductive paste was filled by vacuum printing.

Figure 12:
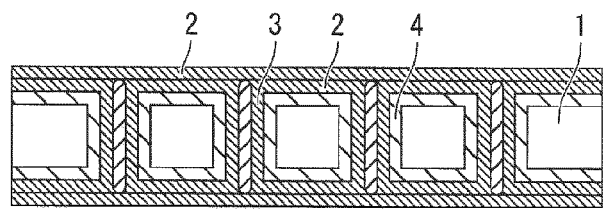
- FIG. 12 is a cross sectional manufacturing process diagram which shows the method for manufacturing the interposer according to the modified example of the first embodiment of the present invention.
Figure 13:
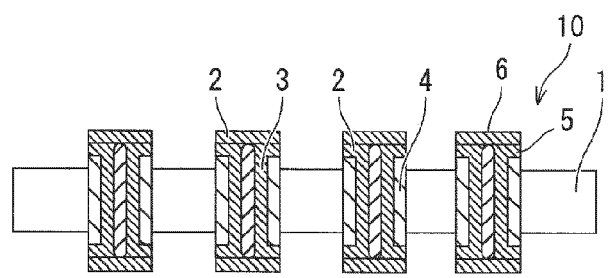
FIG. 13 is a cross sectional manufacturing process diagram which shows the method for manufacturing the interposer according to the modified example of the first embodiment of the present invention.

In the subsequent step of forming a land, the electrolytic copper plating layer 2 formed on both surfaces of the substrate 1 and the conductive paste of the through electrode 3 which protrudes from the through hole 13 were polished by chemical polishing until the thickness on the substrate 1 becomes 3 μm as shown in FIG. 12. Then, the electrolytic copper plating layer 2 with a thickness of 5 μm was formed on the surface of the substrate 1 as a plating which serves as a cover of a conductive paste for the through hole portion. Further, in the step of forming a land, a resist pattern for forming the land 6 was formed by a photosensitive resist in order to form the land 6 having the same size as the through electrode 3 on both ends of the through electrode 3. Then, the electrolytic copper plating layer 2 on the surface of the substrate 1 except for the land 6 and the Cr sputtered film of the inorganic adhesive layer 4 was removed by wet-etching. Accordingly, a core substrate 10 having the through electrode 3 in the substrate 1 was formed as shown in FIG. 13.

Figure 14:
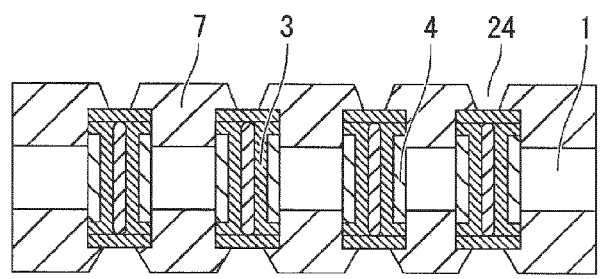
FIG. 14 is a cross sectional manufacturing process diagram which shows the method for manufacturing the interposer according to the modified example of the first embodiment of the present invention.

In the subsequent step of forming an insulative resin layer and a via hole, the insulative resin layer 7 was formed by laminating an insulative resin layer 7 on both surfaces of the core substrate 10. Then, a via hole 24 was formed in the insulative resin layer 7 on the through electrode 3 by using a UV-YAG laser as shown in FIG. 14. The diameter of the via hole 24 was smaller than the diameter of the through electrode 3. Furthermore, smears generated in the via hole 24 by a UV-YAG laser process were cleaned by desmearing by using a treatment solution of alkaline aqueous solution.

Figure 15:
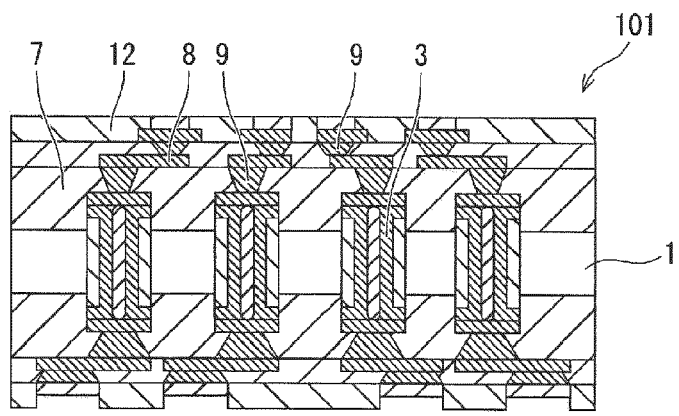
FIG. 15 is a cross sectional manufacturing process diagram which shows the method for manufacturing the interposer according to the modified example of the first embodiment of the present invention.

In the subsequent step of forming a conductive via and a wiring layer, an electroless copper plating was formed as a seed layer on the insulative resin layer 7. Further, a resist pattern in which a wiring layer portion and a conductive via portion (both are not shown in the figure) were open was formed by a negative resist on the seed layer. Then, the electrolytic copper plating of 8 μm thick was formed as a conductive material by a semi-additive process as shown in FIG. 15. After that, the resist and the seed layer of the unnecessary portion were removed to form the wiring layer 8 and the conductive via 9.

A method for manufacturing the semiconductor device (not shown in the figure) according to Example 1-2 included steps of forming a conductive pad for forming a conductive pad on the interposer 101 manufactured in the method for manufacturing the interposer 101, and fixing a semiconductor element for fixing the semiconductor element 11 on the conductive pad.

In the step of forming a conductive pad, a photosensitive solder resist 12 was laminated on the substrate 1 for light exposure and development, and the conductive pad portion (not shown in the figure) was formed by Ni/Au plating.

In the subsequent step of fixing a semiconductor element, the semiconductor element 11 was fixed on the conductive pad by soldering.

In Example 1-2, two layers were disposed on one surface of the wiring layer 8, the solder resist 12 was provided as a surface covering layer, and the surface of the conductive pad was treated with Ni/Au. However, the configuration is not limited thereto.

(Evaluation of Examples 1-1 and 1-2)

From Example 1-1, it was found that providing the inorganic adhesive layer 4 which is located between the substrate 1 and the electrolytic copper plating layer 2 and has a thermal expansion coefficient between those of the substrate 1 and the electrolytic copper plating layer 2 improves the adhesiveness between the substrate 1 and the through electrode 3, and the interposer 100 can be obtained which can prevent detachment of the through electrode 3 in a reliability test under conditions of thermal expansion and thermal contraction.

Further, from Example 1-2, it was found that providing the inorganic adhesive layer 4 which is located between the substrate 1 and the electrolytic copper plating layer 2 and has a thermal expansion coefficient between those of the substrate 1 and the electrolytic copper plating layer 2 improves the adhesiveness between the substrate 1 and the through electrode 3, and the interposer 101 can be obtained which can prevent detachment of the through electrode 3 in a reliability test under conditions of thermal expansion and thermal contraction.

Comparative Example 1

With reference to FIGS. 1 and 15, Comparative Example 1 of the present invention will be described in conjunction with FIGS. 16 to 22.

A low expansion glass having a thickness of 0.3 mm, a size of 200 mm×200 mm and a thermal expansion coefficient of 4 ppm/° C. was provided as a substrate 1.

The inorganic adhesive layer 4 was formed by sputtering a 0.2 μm thick Cr film.

Further, an electrolytic copper plating layer 2 (thermal expansion coefficient: 16 ppm/° C.) was made of a conductive material. The through electrode 3 was formed by a conformal copper plating technique. The conductive layer 5 was formed with a thickness of 8 μm.

The through hole of the through electrode 3 was filled with a conductive paste made up of a mixture material containing copper particles and an organic resin.

An ABF made up of epoxy resin was used as a material for the insulative resin layer 7.

A seed layer for the wiring layer 8 was formed by electroless copper plating. The thickness of the electrolytic copper plating was 8 μm. The wiring layer 8 was formed by a semi-additive process with an LS value of 10 μm.

The conductive via 9 was formed by conformal plating. In forming the conductive via 9 in the insulative resin layer 7, a UV-YAG laser was used.

In forming the through hole 13 in the substrate 1, a pico-second laser was used. The inner diameter of the through hole 13 and the conductive via 9 was 50 μmϕ.

Figure 16:
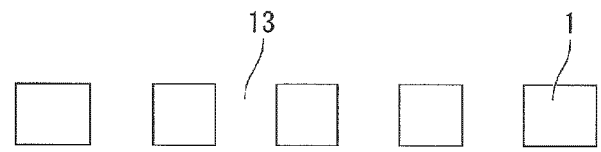
FIG. 16 is a cross sectional manufacturing process diagram which shows a method for manufacturing the interposer according to a comparative example.

In a method for manufacturing an interposer 102 according to Comparative Example 1, the through holes 13 were formed in the substrate 1 by using a pico-second laser as shown in FIG. 16.

Figure 17:
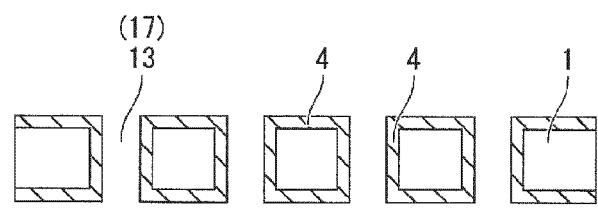
FIG. 17 is a cross sectional manufacturing process diagram which shows the method for manufacturing the interposer according to the comparative example.

Subsequently, as shown in FIG. 17, a sputtered Cr film was deposited on both surfaces of the substrate 1 so that the inorganic adhesive layer 4 was formed on the surface of the substrate 1 and the inner surface of the through hole 13.

Figure 18:
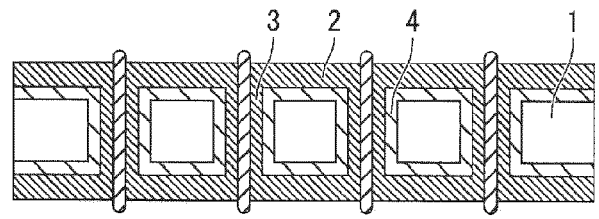
FIG. 18 is a cross sectional manufacturing process diagram which shows the method for manufacturing the interposer according to the comparative example.

Then, as shown in FIG. 18, the electrolytic copper plating layer 2 was formed on the inorganic adhesive layer 4 by using a conductive material. Further, the through electrode 3 was formed in the through hole 13 by a conformal plating technique that fills the through hole 13 with a copper plating. The through-hole of the electrode 3 was cured after the conductive paste was filled by vacuum printing.

Figure 19:
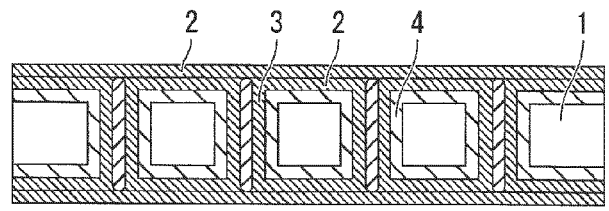
FIG. 19 is a cross sectional manufacturing process diagram which shows the method for manufacturing the interposer according to the comparative example.

Then, as shown in FIG. 19, the electrolytic copper plating layer 2 formed on both surfaces of the substrate 1 and the conductive paste of the through electrode 3 which protrudes from the through hole 13 were polished by chemical polishing until the thickness on the substrate 1 becomes 3 μm. Then, the electrolytic copper plating layer 2 with a thickness of 5 μm was formed on the surface of the substrate 1 as a plating which serves as a cover of a conductive paste for the through hole portion.

Figure 20:
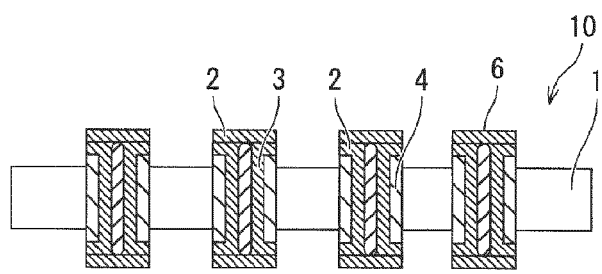
FIG. 20 is a cross sectional manufacturing process diagram which shows the method for manufacturing the interposer according to the comparative example.

As shown in FIG. 20, a resist pattern was formed by a photosensitive resist covering the wiring layer 8 in order to form the wiring layer 8 electrically connected to the through electrode 3. Then, the electrolytic copper plating layer 2 on the surface of the substrate 1 except for the wiring layer 8 and the Cr sputtered film of the inorganic adhesive layer 4 was removed by wet-etching. Accordingly, a core substrate 10 having the conductive layer 5 and the through electrode 3 in the substrate 1 was formed.

Figure 21:
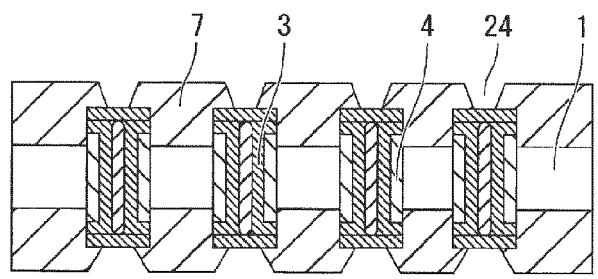
FIG. 21 is a cross sectional manufacturing process diagram which shows the method for manufacturing the interposer according to the comparative example.

Further, as shown in FIG. 21, the insulative resin layer 7 was formed by laminating an insulative resin layer 7 on both surfaces of the core substrate 10. Then, a via hole 24 was formed in the insulative resin layer 7 on the through electrode 3 by using a UV-YAG laser. The diameter of the via hole 24 was smaller than the diameter of the through electrode 3. Furthermore, smears generated in the via hole 24 by a UV-YAG laser process were cleaned by desmearing by using a treatment solution of alkaline aqueous solution.

Figure 22:
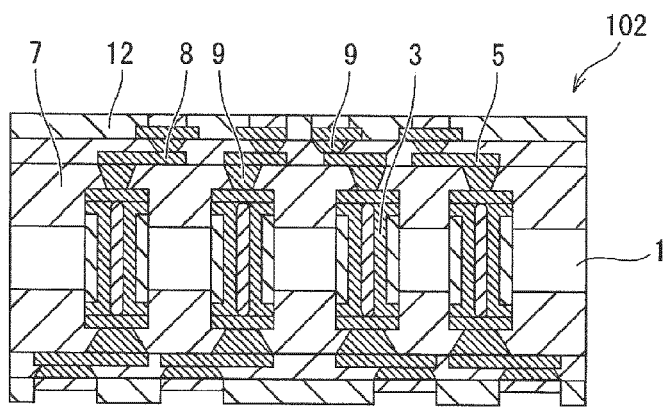
FIG. 22 is a cross sectional manufacturing process diagram which shows the method for manufacturing the interposer according to the comparative example.

Then, an electroless copper plating was formed as a seed layer on the insulative resin layer 7. Further, as shown in FIG. 22, a resist pattern in which a wiring layer portion and a conductive via portion (both are not shown in the figure) were open was formed by a negative resist on the seed layer. Then, the electrolytic copper plating of 8 μm thick was formed as a conductive material by a semi-additive process. After that, the resist and the seed layer of the unnecessary portion were removed to form the wiring layer 8 and the conductive via 9.

Furthermore, in a method for manufacturing a semiconductor device (not shown in the figure) according to Comparative Example 1, a photosensitive solder resist 12 was laminated on the substrate 1 of the interposer 102 manufactured by the method for manufacturing the interposer 102 for light exposure and development, and the conductive pad portion (not shown in the figure) was formed by Ni/Au plating.

Then, the semiconductor element 11 was fixed on the conductive pad by soldering.

(Evaluation of Comparative Example 1)

From Comparative Example 1, it was found that the double-sided wiring layer 8 can obtained in which electrical conductivity was established between the wiring layers 8 on both surfaces of the substrate 1. However, in a reliability test under conditions of thermal expansion and thermal contraction, a problem was found that the through electrode 3 and the conductive layer 5 were detached from the substrate 1 due to the difference in thermal expansion coefficient between the wiring layer 8 made of copper and the substrate 1.

(Comparison of Examples 1-1, 1-2 and Comparative Example 1)

As described above, according to the first embodiment, it is possible to prevent detachment of the through electrode 3 and the conductive layer 5 from the substrate 1 due to thermal expansion and thermal contraction, and to provide the interposer 100, 101 and the semiconductor device 300 with a high reliability.

According to the interposer 100, 101 and the semiconductor device 300 of the first embodiment and the method for manufacturing the same, the above mentioned problems of the present invention can be solved. Details of the problems of the present invention will be described.

Package substrates are conventionally used to connect a fine pitch IC chip to an external substrate such as a daughter board.

Package substrates are formed of a material such as ceramics or resin.

Since a ceramic package substrate uses a sintered metallized material, a resistance is high. Further, since ceramics has a high dielectric constant, it is difficult to mount a high frequency and high performance IC.

On the other hand, since a resin package substrate uses a copper wiring by plating, a wiring resistance can be decreased. Since a resin has a low dielectric constant, it is relatively easy to mount a high frequency and high performance IC.

There are techniques for interposing an interposer between the package substrate and an IC chip, for example, as described in PTL 1 to PTL 4.

In recent years, interposers for high-end applications in which silicon or glass is used as a material for a substrate have been thoroughly studied and attracting attention.

The interposers which use a substrate made of silicon or glass are characterized by use of techniques such as through-silicon via (TSV) and through-glass via (TGV) in which through holes are formed and then filled with a conductive material. The through electrodes formed by this technique have a reduced wiring length between both surfaces, which are connected by a minimum distance, thereby allowing for high electrical properties such as high speed signal transmission.

Further, since the thermal expansion coefficient becomes equal or close to that of the IC chip, changes in substrate dimensions in heating are reduced, which may lead to a high density packaging and a high density wiring. Moreover, a parallel multi-pin connection can be realized by use of through electrodes, and high electrical properties can be obtained without increasing a speed of LSI. This may allow for low power consumption.

In particular, attention has been recently attracted to a glass interposer that uses a glass as a material for the substrate. One of interests on glass interposers is cost reduction. Although silicon interposers are manufactured only in a wafer size, glass interposers can be processed in mass using a large-sized panel. This may solve a cost issue, which has been considered as a major problem in the interposer for a high-end solution.

However, in the manufacturing of interposers, particularly glass interposers having a glass substrate, there are some problems to be overcome. One of such problems is that a conductive layer pattern made of copper or the like is detached from the surface of the glass in a high temperature process during mounting or in a temperature cycle of reliability tests. This occurs due to an insufficiency in adhesive strength between a glass and a copper or the like relative to large differences in thermal expansion coefficients and in elastic moduluses between a glass, which is a substrate, and a copper or the like used for a conductive layer pattern.

In contrast to the interposer, the semiconductor device and the method for manufacturing the same of the prior art having those problem, the interposer 100, 101 according to an aspect of the present invention can better prevent detachment of the conductive layer 5 due to thermal expansion and thermal contraction, thereby better ensuring high reliability. Further, according to an aspect of the present invention, it is possible to provide a method for manufacturing the interposer 100, 101, a semiconductor device having the interposer 100, 101 and a method for manufacturing the semiconductor device.

Second Embodiment

With reference to the drawings, a second embodiment of the present invention will be described.

The following description is provided by way of example in which a glass is used for the substrate 1. The material for the substrate 1 according to the present embodiment is not limited to a glass, and may be a silicon or the like.

Figure 23:
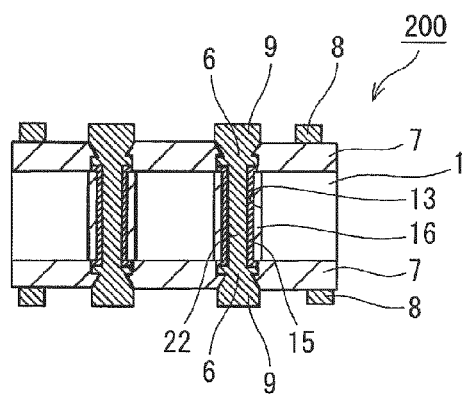
FIG. 23 is a sectional view of a schematic configuration of an interposer according to a second embodiment of the present invention.

As show in FIG. 23, an interposer 200 according to the second embodiment includes a substrate 1 having a through hole 13; an insulative resin layer 7 formed on a surface of the substrate 1; a wiring layer 8 disposed on the substrate 1 with the insulative resin layer 7 interposed therebetween; an embedded resin layer 16 made of an insulative resin formed in the through hole 13; a through electrode 3 which is filled in a connection hole 17 formed of the embedded resin layer 16 in the through hole 13; and a conductive via 9 which is directly connected to the land 6 formed on an end surface of the through electrode 3.

A diameter of the land 6 is smaller than a diameter of the through hole 13.

A thermal expansion coefficient of the embedded resin layer 16 and an insulative resin layer 7 is larger than a thermal expansion coefficient of the substrate 1.

The wiring layer 8 is electrically connected to the conductive via 9 by a conductive material which is not shown in the figure.

Conductive materials forming the wiring layer 8 and the conductive via 9 may be at least one of copper, silver, gold, nickel, platinum, palladium, ruthenium, tin, tin silver, tin silver copper, tin copper, tin bismuth and tin lead, or a compound of at least one of those materials or a mixture of a metal powder of at least one of those materials and a resin material. The same applies to the through electrode 3.

The insulative resin layer 7 and the embedded resin layer 16 are made of one of epoxy/phenol, polyimide, cyclic-olefin, PBO, or a composite of those materials with a linear expansion coefficient (CTE) being in the range of 30 or more and 40 or less.

The through hole 13 may have a maximum diameter in the range of 50 μm or more and 100 μm or less and a depth in the range of 50 μm or more and 400 μm or less.

The connection hole 17 may have a maximum diameter in the range of 40 μm or more and 80 μm or less and a depth in the range of 50 μm or more and 400 μm or less.

A configuration is possible in which the insulative resin layers 7 and the wiring layers 8 are alternately stacked on the substrate 1 and each wiring layer 8 selected from the wiring layers 8 is electrically connected to the adjacent wiring layer 8 via the conductive via 9 which is formed in the insulative layer stacked on the wiring layer 8.

A semiconductor chip (semiconductor element) 11, which is described later, is fixed (mounted) on the interposer 200 to form a semiconductor device 301.

Figure 24:
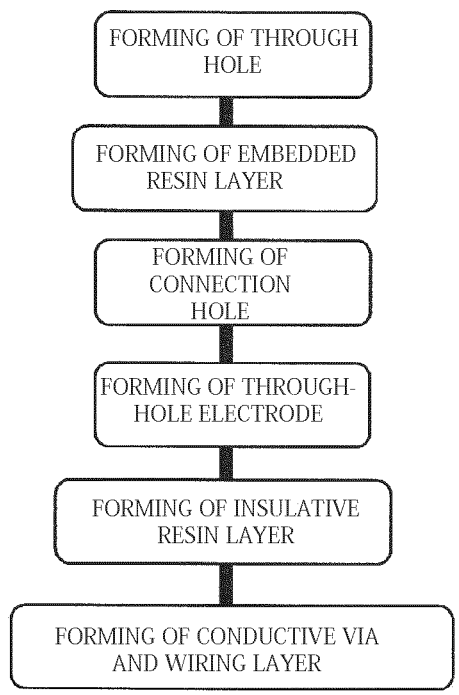
FIG. 24 is a flow chart which shows steps of a method for manufacturing the interposer according to the second embodiment of the present invention.

With reference to FIGS. 24 and 25, a method for manufacturing the interposer 200 will be described.

As shown in FIG. 24, a method for manufacturing the interposer 200 according to the second embodiment includes steps of forming a through hole, forming an embedded resin layer, forming a connection hole, forming a through electrode, forming an insulative resin layer, forming a conductive via and a wiring layer, which are performed in this order.

Each of those steps will be described.

(Forming of Through Hole)

First, as shown in FIG. 25(a), the through holes 13 are formed in the substrate 1.

A thickness of the substrate 1 is, for example, in the range of 50 μm or more and 500 μm or less. The through hole 13 has a diameter, for example, in the range of 50 μm or more and 100 μm or less and a depth, for example, in the range of 50 μm or more and 400 μm or less. The through hole 13 is formed by using an excimer laser, UV-YAG laser, CO$_2$ laser or the like.

(Forming of Embedded Resin Layer)

As shown in FIG. 25(b), the embedded resin layer 16 is formed by filling a insulative resin in the through hole 13. Filling of the embedded resin is performed by screen printing or the like.

(Forming of Connection Hole)

As shown in FIG. 25(c), the connection hole 17 that penetrates the center of the embedded resin layer 16 is formed by irradiating laser at the center of the embedded resin layer 16. The laser for forming the connection hole 17 may be UV-YAG laser, CO$_2$ laser or the like.

Thus, the connection hole 17 as shown in FIG. 25(c) is formed. The connection hole 17 has a maximum diameter, for example, in the range of 40 μm or more and 80 μm or less and a depth, for example, in the range of 50 μm or more and 400 μm or less. In this case, the depth of the connection hole 17 is the same as the thickness of the substrate 1. The connection hole 17 is formed so as not to be in contact with a side surface of the through hole 13. Thus, the connection hole 17 is formed in the embedded resin layer 16 as shown in FIG. 25(c). Further, the inner wall and the surface of the embedded resin layer 16 is etched by desmearing if necessary in order to enhance adhesiveness of the electrode layer. As the connection hole 17 in which an electrode is disposed is formed in the embedded resin which can be easily processed, a hole shape suitable for forming the electrode can be selected.

Then, as shown in FIG. 25(d), after the surface of the embedded resin layer 16 is roughened, a seed layer 14 is formed by electroless plating on the surface of the connection hole 17 and the surface of the substrate 1. Then, the seed layer 14 formed on the surface of the substrate 1 is patterned by a resist 15. The seed layer 14 promotes adhesiveness to the layer made of a conductive material. As shown in FIG. 25(e), the resist 15 is formed by a photolithography process in which an opening of the resist 15 is formed so as not to expose the surface of the substrate 1.

(Forming of Through Electrode)

As shown in FIG. 25(f), the through electrode 3 is formed by filling the connection hole 17 and an opening of the resist 15 with a conductive material. The through electrode 3 is formed of the lands 6 disposed on both end surfaces and the connection electrode 22.

Conductive materials forming the through electrode 3 are at least one of copper, silver, gold, nickel, platinum, palladium, ruthenium, tin, tin silver, tin silver copper, tin copper, tin bismuth and tin lead, or at least one compound of those materials, or at least one mixture of a metal powder of those materials and a resin material.

As shown in FIG. 25(g), after the resist 15 is removed from the surface of the substrate 1, the seed layer 14 is removed by etching so that the through electrode 3 is formed with the lands 6 protruding from the surface of the substrate 1. Since the through electrode 3 is formed without being in contact with the substrate 1, a thermal stress in heating is released by the embedded resin layer 16. Further, since the electrode is formed on the resin, the seed layer 14 in the connection hole 17 can be formed by a wet process such as electroless plating. Accordingly, the seed layer 14 can be uniformly formed in the connection hole 17, thereby preventing a void in the electrode.

(Insulative Resin Layer Forming (Laminating) Step)

As shown in FIG. 25(h), the insulative resin layer 7 is formed on two surfaces of the substrate 1 shown in FIG. 25(g). This insulative resin layer 7 is also referred to as a first insulative resin layer 7 since it is located closest to the substrate 1.

The insulative resin layer 7 is formed, for example, by laminating a resin film on the surface of the substrate 1. Examples of resin film for forming the insulative resin layer 7 include ABF-GX-T31 manufactured by Ajinomoto Fine-Techno Co., Inc.

The insulative resin layer 7 is preferably made of one of epoxy/phenol, polyimide, cyclic-olefin, PBO, or a composite of those materials with a linear expansion coefficient being in the range of 30 or more and 40 or less.

(Forming of Conductive Via and Wiring Layer)

As shown in FIG. 25(h), a portion of the first insulative resin layer 7 which is located immediately above the land 6 is removed by using a laser. Thus, a connection via (via hole) 24 as shown in FIG. 25(i) is formed.

The connection via 24 has a bottom diameter smaller than a diameter of the land 6, and is formed such that the entire bottom is located on the land 6. The land 6 has a diameter smaller than a diameter of the through hole 13.

As shown in FIG. 25(j), after the insulative resin layer 7 is roughened, the first conductive via 9 is formed by filling the connection via 24 with a conductive material. In addition to that, the wiring layer 8 made of the conductive material is also formed. Although the connection via 24 and the wiring layer 8 are shown as being spaced from each other in FIG. 25(j), which is a cross sectional view, they are electrically connected. FIG. 25(k) is provided as a cross sectional view of FIG. 25(j).

In forming of the wiring layer 8 and the conductive via 9, after the seed layer 14 is formed by electroless plating, for example, as shown in FIG. 25(e), a pattern by the resist 15 is formed by electrolytic plating, and the seed layer 14 is removed by etching after removing the resist 15.

Conductive materials forming the wiring layer 8 and the conductive via 9 are at least one of copper, silver, gold, nickel, platinum, palladium, ruthenium, tin, tin silver, tin silver copper, tin copper, tin bismuth and tin lead, or at least one compound of those materials, or at least one mixture of a metal powder of those materials and a resin material.

In the above steps, the interposer (glass interposer) 200 shown in FIG. 23 is manufactured.

The conductive via 9 and the land 6 are directly connected to each other. The wiring layers 8 on the front and rear surfaces of the interposer 200 are electrically connected by the conductive via 9 and the through electrode 3, and all the electrically conductive portions are not in contact with the substrate 1. Accordingly, a thermal stress in a heating process is released by the resin. As a result, the interposer which prevents detachment of the electrically conductive portions and ensures high reliability can be obtained.

A thermal expansion coefficient of the embedded resin layer 16 and an insulative resin layer 7 is preferably larger than a thermal expansion coefficient of the substrate 1.

Here, a plurality of insulative resin layers 7 and a plurality of wiring layers 8 are provided so that the insulative resin layer 7 and the wiring layer 8 are alternately stacked. Different number of layers of the insulative resin layers 7 and the wiring layers 8 may be stacked on the front and rear surfaces of the substrate 1. In this case, each wiring layer 8 selected from the wiring layers 8 is electrically connected to the adjacent wiring layer 8 via the conductive via 9 which is formed in the insulative layer stacked on the wiring layer 8.

Figure 31:
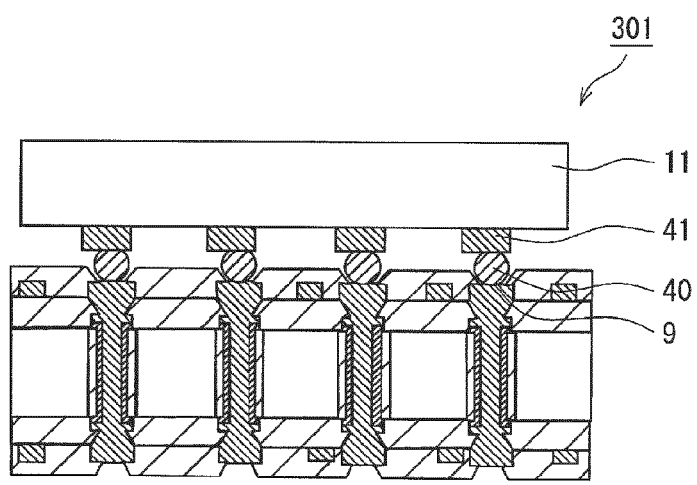
FIG. 31 is a sectional view of a schematic configuration of a semiconductor device in which a semiconductor chip is mounted on the interposer according to the second embodiment of the present invention.

Then, the interposer 200 and a connection pad 41 of the semiconductor chip 11 are mounted via a solder 40 to form the semiconductor device 301 as shown in FIG. 31. The connection pad 41 of the semiconductor chip 11 corresponds to the conductive via 9. The insulative resin layer 7 disposed on the conductive via 9 is partially removed to form the solder. The same method as the method for manufacturing the connection via 24 may be used.

Third Embodiment

With reference to the drawings, third embodiment of the present invention will be described.

The following description is provided by way of example in which a glass is used for the substrate 1 similarly to the second embodiment. The material for the substrate 1 according to the present embodiment is not limited to a glass, and may be a silicon or the like.

Figure 26:
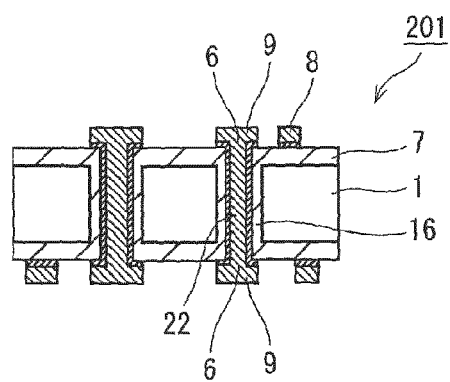
FIG. 26 is a sectional view of a schematic configuration of an interposer according to a third embodiment of the present invention.

FIG. 26 is a cross sectional view of a schematic configuration of an interposer 201 according to a third embodiment of the present invention.

The interposer 201 according to the third embodiment has a basic configuration which is the same as that of the interposer 200 according to the second embodiment.

In the example described in the second embodiment, the substrate 1 is used as a starting material, and the through electrode 3 is formed therein and then the insulative resin layer 7 is formed so that the wirings on the front and rear surfaces are connected via the through electrode 3 and the conductive via 9. In contrast, the present embodiment describes an example which uses a substrate 30 having an insulative resin layer as a starting material, which is made up of the substrate 1 and the insulative resin layer 7 formed on the surface of the substrate 1. In the present embodiment, a linear expansion coefficient (CTE) of the insulative resin layer 7 is preferably in the range of 30 or more and 40 or less.

Figure 27:
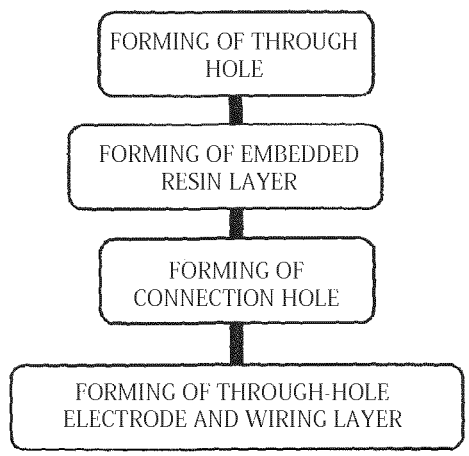
FIG. 27 is a flow chart which shows steps of a method for manufacturing the interposer according to the third embodiment of the present invention.

As shown in FIG. 27, a method for manufacturing the interposer 201 according to the present embodiment includes steps of forming a through hole, forming an embedded resin layer, forming a connection hole, forming a through electrode and a wiring layer, which are performed in this order.

The following describes each of those steps.

(Forming of Through Hole)

First, the substrate 30 having an insulative resin layer shown in FIG. 28(a) is used as a starting material and the through hole 13 is formed as shown in FIG. 28(b). The through hole 13 is formed by using an excimer laser, UV-YAG laser, $CO_2$ laser or the like.

(Forming of Embedded Resin Layer)

As shown in FIG. 28(c), the through hole 13 is filled with the embedded resin layer 16, for example, by screen printing. The CTE of the embedded resin layer 16 is preferably in the order of range from 30 to 40, and is preferably different from that of the insulative resin layer 7 by a small amount.

(Forming of Connection Hole)

As shown in FIG. 28(d), the embedded resin layer 16 is partially removed by irradiating laser at the center of the embedded resin layer 16. For the same reason as described in the second embodiment, the connection hole 17 suitable for forming the electrode can be formed.

(Forming of Through Electrode and Wiring Layer)

As shown in FIG. 28(e), after the insulative resin layer 7 and the embedded resin layer 16 are roughened, the seed layer 14 is formed by electroless plating and then patterned by the resist 15 as shown in FIG. 28(f). Since the substrate 30 having an insulative resin layer is used as the substrate 1 in the present embodiment, the substrate 1 is not in contact with the plating regardless of the pattern, thereby enhancing the degree of freedom in wiring design.

As shown in FIG. 28(f), the connection hole 17 and the opening of the resist 15 are filled with a conductive material to form the through electrode 3. The conductive vias 9 directly connected to the lands 6 on both surfaces of the through electrode 3 are formed at a time.

As shown in FIG. 28(g), after the resist 15 is removed, the seed layer 14 is removed by etching so that the through electrode 3 and the wiring layer 8 are formed as shown in FIG. 28(h). Although the through electrode 3 and the wiring layer 8 are shown as being spaced from each other in FIG.

28(*h*), which is a cross sectional view, they are electrically connected. FIG. 25(*k*) is provided as a cross sectional view of FIG. 25(*h*).

In the above steps, the interposer (glass interposer) 201 shown in FIG. 26 is manufactured.

For the same reason as described in the second embodiment, the interposer which has high heat resistance and high reliability can be obtained.

Further, since the starting material of the present embodiment is the substrate 30 having an insulative resin layer, the through electrode 3 and the wiring layer 8 can be formed at a time. Accordingly, the wiring layers 8 on the front and rear surfaces of the interposer 201 can be connected without forming the conductive via 9, thereby reducing the number of steps.

In the interposer 200, 201 obtained in the above embodiments, techniques suitable for the size of wiring to be formed can be appropriately selected. For example, a build-up technique is used for forming the wiring layer 8 of a fine size, while a conventional technique of laminating a prepreg and copper foil is used for forming the wiring layer 8 which does not have a fine wiring size in manufacturing the interposer 200, 201.

Figure 32:
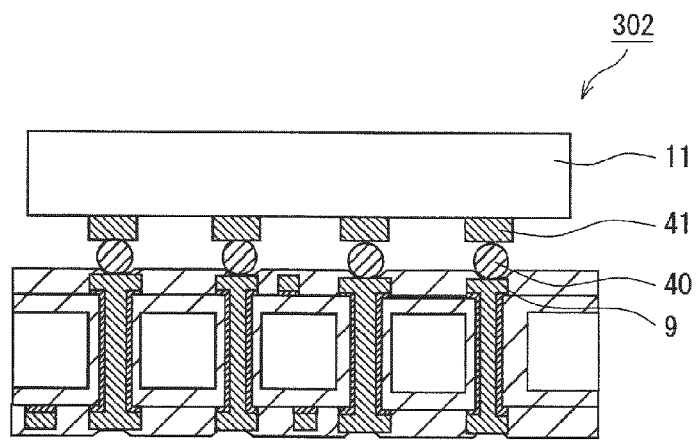
FIG. 32 is a sectional view of a schematic configuration of a semiconductor device in which a semiconductor chip is mounted on the interposer according to the third embodiment of the present invention.

Then, the semiconductor chip 11 or the like is mounted on the interposer 201 to form the semiconductor device 302 as shown in FIG. 32.

In the above embodiments, the through hole 13 is formed after the insulative resin layer 7 is formed in the substrate 1. However, the insulative resin layer (the embedded resin layer 16 and the insulative resin layer 7) may be formed on the surface of the substrate 1 and in the through hole 13 by immersing the substrate 1, in which the through hole 13 is formed, in a solution of the dissolved insulative resin layer 7 and then dried.

Figure 28:
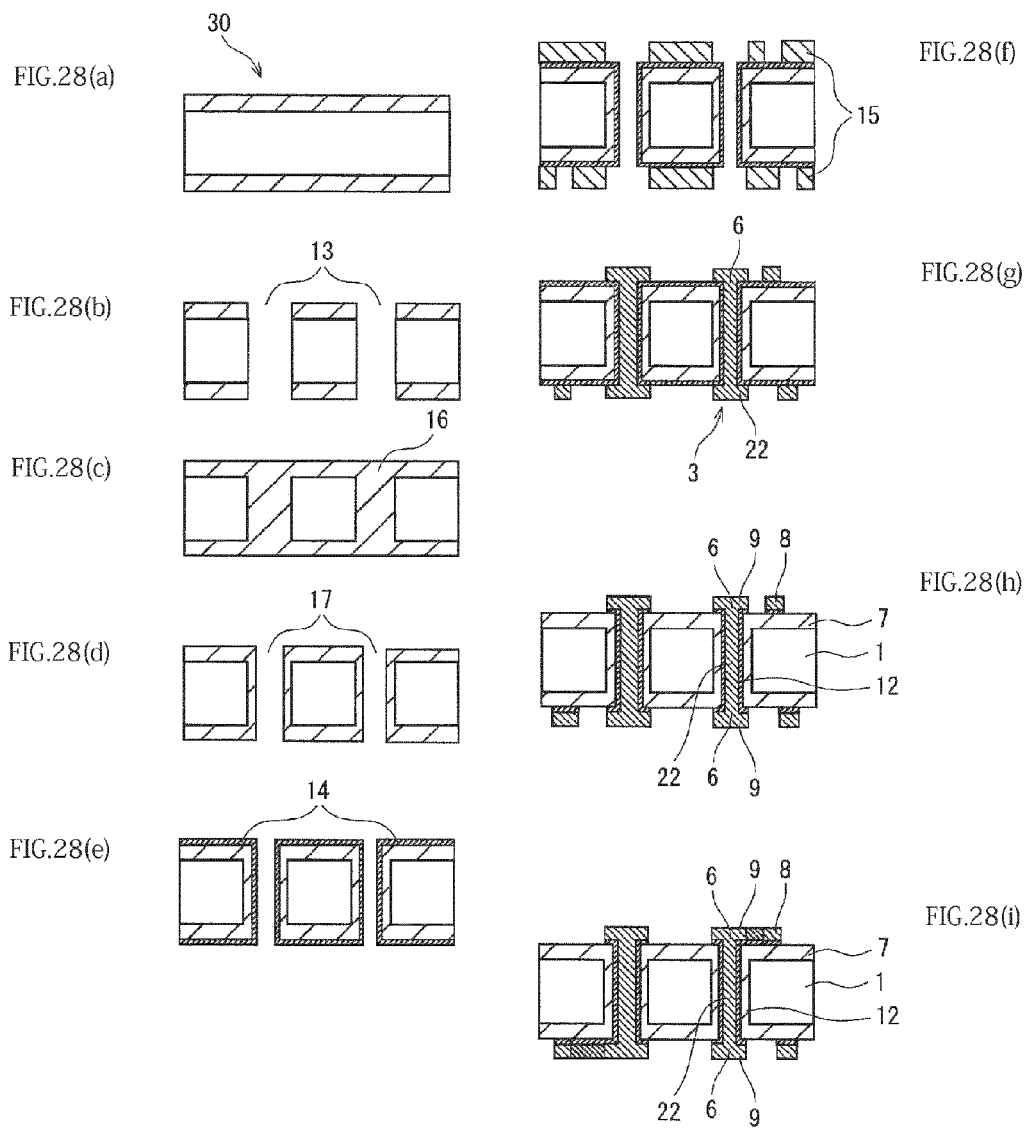
FIG. 28($a$) through FIG. 28($i$) are cross-sectional manufacturing process diagrams which show processes of the method for manufacturing the interposer according to the third embodiment of the present invention.
Figure 29:
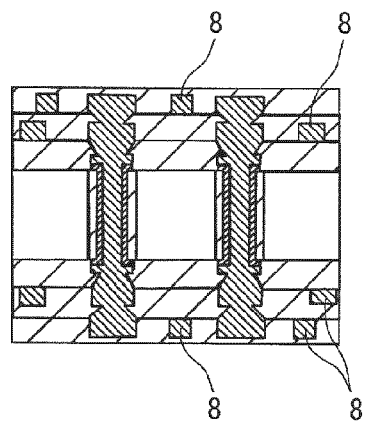
FIG. 29 is a sectional view of a schematic configuration of the interposer according to a modified example of the second embodiment of the present invention.
Figure 30:
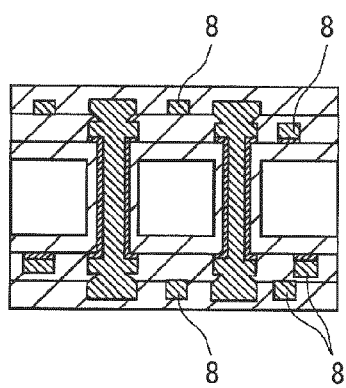
FIG. 30 is a sectional view of a schematic configuration of the interposer according to a modified example of the third embodiment of the present invention.

Further, although only one wiring layer 8 is provided in the above embodiment, the wiring layers 8 and the insulative resin layers 7 may be alternately stacked so as to be connected via the conductive vias 9 to form an interposer having a plurality of wiring layers 8 as shown in FIGS. 28 and 29.

Second Example

Example 2-1 of the present invention will be described. The present example corresponds to a manufacturing method for the above second embodiment (FIG. 23).

Example 2-1

First, a low expansion grass substrate (thickness 300 µm, CTE: 3.5) having the through hole 13 with an opening diameter of 70 µm was provided as a glass substrate 1 (see FIG. 25(*a*)). After a via filling resin (CTE 40) manufactured by San-ei Kagaku Co., Ltd was inserted into the glass substrate 1 by screen printing, the embedded resin layer 16 was smoothed by buffing (see FIG. 25(*b*)).

Then, the connection hole 17 having an opening diameter of 50 µm was formed by irradiating a UV-YAG laser onto the formed embedded resin layer 16. After that, roughening of resin was performed by desmearing. Then, the seed layer 14 was formed by electroless plating (see FIG. 25(*d*)).

A dry film resist RY-3525 (thickness 25 µm) manufactured by Hitachi Chemical Company, Ltd was laminated on both surfaces of the obtained glass substrate 1. An opening having an opening diameter smaller than that of the connection hole 17 and an opening bottom not in contact with the glass was formed by a photolithography process. Then, the through electrode 3 made up of the connection electrode 22 in the connection hole 17 and the lands 6 on the upper and lower ends of the connection electrode 22 was formed by electrolytic copper plating (see FIG. 25(*f*)).

After the resist 15 was removed (see FIG. 25(*g*)), GX-T31 (thickness 15 µm) manufactured by Ajinomoto Fine-Techno Co., Inc. was bonded by thermal compression on the surface of the glass substrate 1 (see FIG. 25(*h*)). Then, the connection via 24 was formed immediately above the land 6 by using a UV-YAG laser (see FIG. 25(*i*)).

After the insulative resin layer 7 and the embedded resin layer 16 were roughened by desmearing, the seed layer 14 was formed by electroless plating. Then, a pattern by a resist was formed by a photolithography process, and then steps of electrolytic plating, resist detaching, flash etching were performed so as to form the interposer 200 which uses the glass substrate 1 having the through electrode 3 (see FIG. 25(*j*)).

Example 2-2 of the present invention will be described. The present example corresponds to a manufacturing method for the above third embodiment (FIG. 26).

Example 2-2

First, GX-T31 (thickness 15 µm) manufactured by Ajinomoto Fine-Techno Co., Inc. was bonded by thermal compression on both surfaces of a low expansion glass substrate (thickness 300 µm, CTE: 3.5) of the glass substrate 1 (see FIG. 28(*a*)).

The through hole 13 having an opening diameter of 70 µm was formed by irradiating a UV-YAG laser onto the glass substrate 1 (see FIG. 28(*b*)). After a via filling resin (CTE 40) manufactured by San-ei Kagaku Co., Ltd was inserted into the glass substrate 1 by screen printing, the embedded resin layer 16 was smoothed by buffing (see FIG. 28(*c*)).

Then, the connection hole 17 having an opening diameter of 50 µm was formed by irradiating a UV-YAG laser onto the formed embedded resin layer 16. After that, roughening of resin was performed by desmearing. Then, the seed layer 14 was formed by electroless plating (see FIGS. 28(*d*), 28(*e*)).

A dry film resist RY-3525 (thickness 25 µm) manufactured by Hitachi Chemical Company, Ltd was laminated on both surfaces of the obtained glass substrate 1. After an opening having an opening diameter smaller than that of the connection hole 17 was formed by a photolithography process, the through electrode 3 made up of the connection electrode 22 and the lands 6 on the upper and lower ends of the connection electrode 22 was formed by electrolytic copper plating as well as the wiring layer 8 (see FIGS. 28(*f*), 28(*g*)).

Then, steps of resist detaching and flash etching were performed so as to form the interposer 201 which includes the glass substrate 1 having the through electrode 3 (see FIG. 28(*h*)).

As described above, according to the interposer 200, 201, the semiconductor device 301, 302 and methods for manufacturing the same of the second and the third embodiments, the problems of the present invention can be solved. Furthermore, the following problems can also be solved. Details of such problems will be described.

The semiconductor elements such as various memories, CMOSs, CPUs manufactured in wafer processes have terminals for electrical connection. The pitch of the connection terminals and the pitch of the connecting section on the printed wiring board to be electrically connected to the semiconductor element are different in scale from several to several tens of times. As a result, when the semiconductor element and the printed wiring board are attempted to be electrically connected, an intermediary substrate for pitch conversion (substrate for mounting semiconductor elements), which is called interposer, is used. In general, semiconductor elements are mounted on one surface of the interposer, while a printed wiring board is connected on the other surface of the substrate or in the periphery of the substrate.

The conventional interposers for mounting semiconductor elements to the printed wiring board have used a substrate using an organic material. However, due to a rapid development of electronics such as smart phones in recent years, 3 or 2.5 dimensional mounting techniques becomes indispensable in which semiconductor elements are vertically stacked, or semiconductor elements of different types are arrayed on the same substrate. The aforementioned technical development seems to enable increase in speed and capacity and low energy consumption. On the other hand, as the density of semiconductor elements increases, the interposer needs to have a finer wiring. However, the conventional organic substrates have a problem on forming of fine wirings matched in scale since resins undergo expansion and contraction due to moisture absorption or under the effect of temperature.

In light of those problems, development of interposers which use silicon or glass for the substrate have been recently attracting attention. Since the substrate made of such materials is less likely to be effected by moisture absorption or expansion and contraction, it is advantageous for forming fine wirings. Further, through electrodes such as through-silicon vias (TSVs) and through-glass vias (TGVs) can be formed by forming through holes then filling with a conductive material. This through electrode connects the wirings on the front and rear surfaces of the substrate in a minimum distance, thereby achieving high electrical properties such as high-speed signal transmission. Moreover, since the wiring is formed inside, this technique is also effective for providing devices with small size and high density. In addition, since a parallel multi-pin connection can be realized by use of through electrodes, the need for increasing a speed of LSI itself can be eliminated, thereby achieving low power consumption. As described above, a number of advantages can be provided.

In comparison of both, silicon interposers (Si-IP) are advantageous over glass interposers (G-IP) in fine machining properties, and has an established process of wiring and TSV forming. However, silicon interposers have a disadvantage in that they can operate only for a circular silicon wafer and cannot operate in the periphery of the wafer. Further, the cost increases since a mass production in a large size is not possible. On the other hand, mass operation in a large panel is possible for G-IP. Further, manufacturing in roll to roll is also possible. Therefore, the cost can be largely reduced. Furthermore, unlike TGV which forms through holes by electric discharge or laser processing, TSV forms holes by gas etching, which causes increase in cost due to increase in processing time and a wafer thinning process.

As for electrical properties, G-IP is advantageous over Si-IP in that it does not need to consider generation of parasitic elements in a high speed circuit since the substrate itself is an insulator, and has good electrical properties. Further, using a glass for a substrate eliminates the need of forming an insulation film, thereby increasing the insulation reliability and reducing the cycle time.

As described above, using a glass substrate contributes to manufacturing of interposer with reduced cost. However, there are problems in that processes for forming a fine wiring and TGV are not yet established, and adhesiveness between copper, which is mainly used for wiring materials, and glass is low.

In general, in forming of a wiring layer in the glass substrate, an inorganic adhesive layer is formed on the surface of the glass to improve adhesiveness of the wiring layer, and then, the wiring layer and the through electrode are formed thereto. In this technique, although adhesiveness of the glass and the wiring layer can be obtained, difference in thermal expansion coefficient between the glass and the conductive layer is large. Accordingly, a thermal stress is generated in temperature cycles, and the glass substrate and the conductive layer are detached from each other, leading to a failure in electrical connection.

In addition, the inorganic adhesive layer often has electrical conductivity, etching of the adhesive layer is necessary in addition to copper etching in a process of forming the wiring layer, which causes increase in cost.

In contrast to the conventional interposers, semiconductor devices and methods for manufacturing the same having the aforementioned problems, the interposer 200, 201 according to an aspect of the present invention provides a configuration in which the through hole 13 in the substrate 1 is filled with the embedded resin layer 16 which has high adhesiveness to the conductive layer 5 and a thermal expansion coefficient larger than that of the substrate 1 and smaller than that of the conductive layer 5, such that the wiring layers 8 on the front and rear surfaces are electrically connected via the through electrode 3 which is made up of the conductive layer 5 in the connection hole 17 at the center of the embedded resin layer 16 and the lands 6 formed on the upper and lower sides of the embedded resin layer 16 and having a diameter which is not in contact with the substrate 1, the wiring layer 8 formed on the insulative resin layer 7, and the conductive via 9 formed on the insulative resin layer 7. With this configuration, the substrate 1 made of a glass or the like and the conductive layer 5 are not in contact with each other, thereby releasing a thermal stress due to heating.

Therefore, according to the interposer 200, 201 of an aspect of the present invention, detachment of the conductive layer 5 can be prevented and the interposer with high electrical connection reliability can be provided. Further, according to an aspect of the present invention, a method for manufacturing the interposer 200, 201, and the semiconductor device 301, 302 having the interposer 200, 201, and a method for manufacturing the semiconductor device 301, 302 can be provided.

As described above, the present invention is described with reference to specific embodiments. However, those description does not intend to limit the invention. That is, the interposer or the semiconductor device of the present invention can be manufactured by combining configurations described in each of the embodiments.

For example, the first embodiment and the second embodiment can be combined to manufacture the interposer or the semiconductor device of the present invention.

Furthermore, a person skilled in the art would understand another embodiment of the present invention as well as the disclosed embodiment when reading the description of the present invention. Therefore, the scope of the appended claims should be construed to cover the modified examples and embodiments included in the scope of the present invention.

INDUSTRIAL APPLICABILITY

The present invention relates to interposers and semiconductor devices, and can be applied to interposers disposed between package substrates and IC chips and semiconductor devices having interposer for connecting IC chips.

REFERENCE SIGNS LIST

1 ... substrate
2 ... electrolytic copper plating layer
3 ... through electrode
4 ... inorganic adhesive layer
5 ... conductive layer
6 ... land
7 ... insulative resin layer
8 ... wiring layer
9 ... conductive via
10 ... core substrate
11 ... semiconductor element
12 ... solder resist
13 ... through hole
14 ... seed layer
15 ... resist
16 ... embedded resin layer
17 ... connection hole
18 ... solder ball
22 ... connection electrode
24 ... connection via (via hole)
30 ... substrate having insulative resin layer
40 ... solder
41 ... connection pad
100 ... interposer
101 ... interposer
102 ... interposer
200 ... interposer
201 ... interposer
300 ... semiconductor device
301 ... semiconductor device
302 ... semiconductor device.

What is claimed is:

1. An interposer comprising:
a substrate having a through hole;
at least one insulative resin layer formed on a surface of the substrate and including a conductive via;
at least one wiring layer disposed on the substrate with the at least one insulative resin layer interposed therebetween;
an inorganic adhesive layer formed only on a side surface of the through hole; and
a through electrode filled in a connection hole which is formed by the inorganic adhesive layer in the through hole so as to establish electrical connection between both surfaces of the substrate, wherein
the through electrode is electrically connected to the at least one wiring layer via the conductive via, and
a thermal expansion coefficient of the inorganic adhesive layer is larger than a thermal expansion coefficient of the substrate and smaller than a thermal expansion coefficient of the through electrode,
wherein the interposer further comprises a land which is electrically conductive and disposed between the through electrode and the conductive via,
wherein the through electrode is electrically connected via the land to the conductive via, and
wherein the land has a diameter which is the same as a diameter of the through hole.

2. The interposer of claim 1, wherein the inorganic adhesive layer is a single layered film made of a single material, or a layered film of two or more layers made of two or more materials, selected from tin oxide, indium oxide, zinc oxide, nickel, nickel phosphorous, chromium, chromium oxide, aluminum nitride, aluminum oxide, tantalum, titanium and copper.

3. The interposer of claim 1, wherein a material for the at least one insulative resin layer is a single material or a composite of materials selected from epoxy/phenol resin, polyimide resin, cyclic-olefin and PBO resin.

4. The interposer of claim 1, wherein a conductive material which forms the at least one wiring layer and the conductive via is at least one of copper, silver, gold, nickel, platinum, palladium, ruthenium, tin, tin silver, tin silver copper, tin copper, tin bismuth and tin lead, or at least one compound of these materials, or at least one mixture of a metal powder of these materials and a resin material.

5. The interposer of claim 1, wherein the through hole has a maximum diameter in the range from 50 µm to 100 µm and a depth in the range from 50 µm to 400 µm.

6. The interposer of claim 1, wherein the connection hole has a maximum diameter in the range from 40 µm to 80 µm and a depth in the range from 50 µm to 400 µm.

7. The interposer of claim 1, wherein the at least one insulative resin layer comprises a plurality of insulative resin layers, the at least one wiring layer comprises a plurality of wiring layers, and the plurality of insulative resin layers and the plurality of wiring layers are alternately stacked, and each respective wiring layer of the plurality of wiring layers is electrically connected to an adjacent wiring layer via the conductive via which is formed on a respective one of plurality of insulative resin layers stacked on a respective one of the plurality of wiring layers.

8. The interposer of claim 1, wherein a conductive material which forms the through electrode is at least one of copper, silver, gold, nickel, platinum, palladium, ruthenium, tin, tin silver, tin silver copper, tin copper, tin bismuth and tin lead, or at least one compound of these materials, or at least one mixture of a metal powder of these materials and a resin material.

9. The interposer of claim 1, wherein a diameter of the conductive via facing the substrate is smaller than a diameter of the through hole.

10. The interposer of claim 1, wherein the substrate is a glass substrate.

11. A semiconductor device comprising:
the interposer of claim 1; and a semiconductor element which is stacked on and fixed to the interposer.

* * * * *